United States Patent
Yang et al.

(10) Patent No.: US 7,525,173 B2
(45) Date of Patent: Apr. 28, 2009

(54) LAYOUT STRUCTURE OF MOS TRANSISTORS ON AN ACTIVE REGION

(75) Inventors: Hyang-Ja Yang, Suwon-si (KR); Su-Jin Park, Seoul (KR); Uk-Rae Cho, Suwon-si (KR); Sung-Hoon Kim, Seongnam-si (KR)

(73) Assignee: Samsung Electronics, Ltd, Gyeonggi-do (KR)

( * ) Notice: Subject to any disclaimer, the term of this patent is extended or adjusted under 35 U.S.C. 154(b) by 0 days.

(21) Appl. No.: 11/485,341

(22) Filed: Jul. 13, 2006

(65) Prior Publication Data

US 2007/0020858 A1 Jan. 25, 2007

(30) Foreign Application Priority Data

Jul. 22, 2005 (KR) .................. 10-2005-0066574

(51) Int. Cl.
 *H01L 29/78* (2006.01)
(52) U.S. Cl. .................. 257/506; 257/E27.014
(58) Field of Classification Search .......... 257/506, 257/341
See application file for complete search history.

(56) References Cited

U.S. PATENT DOCUMENTS

| 6,867,465 | B2* | 3/2005 | Dono | 257/401 |
| 2003/0140323 | A1* | 7/2003 | Dono | 716/5 |
| 2005/0189595 | A1* | 9/2005 | Okamoto et al. | 257/368 |
| 2005/0275032 | A1* | 12/2005 | Kodama et al. | 257/355 |

* cited by examiner

*Primary Examiner*—Jerome Jackson, Jr.
*Assistant Examiner*—Paul A Budd
(74) *Attorney, Agent, or Firm*—Harness, Dickey, & Pierce (57) ABSTRACT

In a layout structure of a plurality of metal oxide semiconductor (MOS) transistors, the layout structure may include a first group of MOS transistors having first drain regions and first source regions that are individually allocated to a group active region that is isolated from all sides by a trench isolation, and a second group of MOS transistors having second drain regions and second source regions allocated to the group active region. The second group is disposed between the first group and an edge of the group active region. One or both of the first drain regions and first source regions are not in contact with an edge of the trench isolation in a length direction of a finger-type gate electrode.

4 Claims, 12 Drawing Sheets

LAYOUT STRUCTURE OF MOS TRANSISTORS ON AN ACTIVE REGION

PRIORITY STATEMENT

This U.S. nonprovisional patent application claims priority under 35 U.S.C. §119 of Korean Patent Application 10-2005-0066574 filed on Jul. 22, 2005, in the Korean Intellectual Property Office (KIPO), the entire contents of which is hereby incorporated by reference.

BACKGROUND OF THE INVENTION

1. Field of the Invention

Example embodiments of the present invention in general relate to a layout of metal-oxide semiconductor (MOS) transistors and methods of disposing MOS transistors during fabrication for use in a highly integrated semiconductor memory device.

2. Description of the Related Art

In general, volatile semiconductor memory devices such as a dynamic Random Access Memory (RAM) or static RAM etc. are mounted as the memory becomes higher in speed and higher integration increases. This is done in conformity with higher performance of electronic systems such as a personal computer, electronic communication appliances, etc.

Manufacturers of memory chips have been trying to dispose and manufacture memory cells so as to match a scaled-down critical dimension and functional circuits connected to the memory cells. Thus, techniques to dispose circuits in a functional circuit region, i.e., a cell core region, which is adjacent to a cell formation region where memory cells are being rapidly scaled-down in the existing technique becomes an important factor in determining a high integration level. In the functional circuit region, a core logic circuit such as a column decoder (which functions as an interface circuit for a drive of unit memory cell) may be installed. Thus, techniques to more efficiently dispose MOS transistors of a circuit within the functional circuit region, while taking account of size limitations and without lowering the functionality, is required for increasingly higher speed and highly integrated semiconductor memory devices.

Meanwhile, scale-down of given semiconductor devices is becoming increasingly advanced with the progress of semiconductor manufacturing technology. One factor heightening the scale-down is known as a shallow trench isolation (STI) technology. The STI technology is a device isolation process to operationally isolate semiconductor devices formed on a semiconductor substrate. A shallow trench may be formed between devices to isolate semiconductor devices, and an insulation layer such as an oxide layer is filled within the formed shallow trench to obtain a desired isolation effect.

Recent trends to improve high integration of semiconductor devices make an insulation function of the STI substantially useless. An operating characteristic of certain semiconductor devices, as a stress influence of the STI largely increases based on the high integration tendency, may be substantially varied. Given parameters associated with this operating characteristic, a mobility and threshold voltage of carriers within a MOS transistor, and influences from other secondary orders may be contained.

Semiconductor manufacturers have continuously been endeavoring to increase simulation precision depending on a given layout, modeling with such influences. To substantially reduce a mechanical influence based on a given layout, a more desirable layout of transistors may be required.

Until recently, to reduce a critical dimension (CD) variation of a gate of polysilicon material (hereinafter, referred to as 'gate poly') in manufacturing transistors isolated through STI, dummy gate poly patterns which were not relevant to device operation were formed in parallel, like gate poly patterns of a transistor used as an actual device. This will be shown in more detail FIG. 4.

Figure 1:
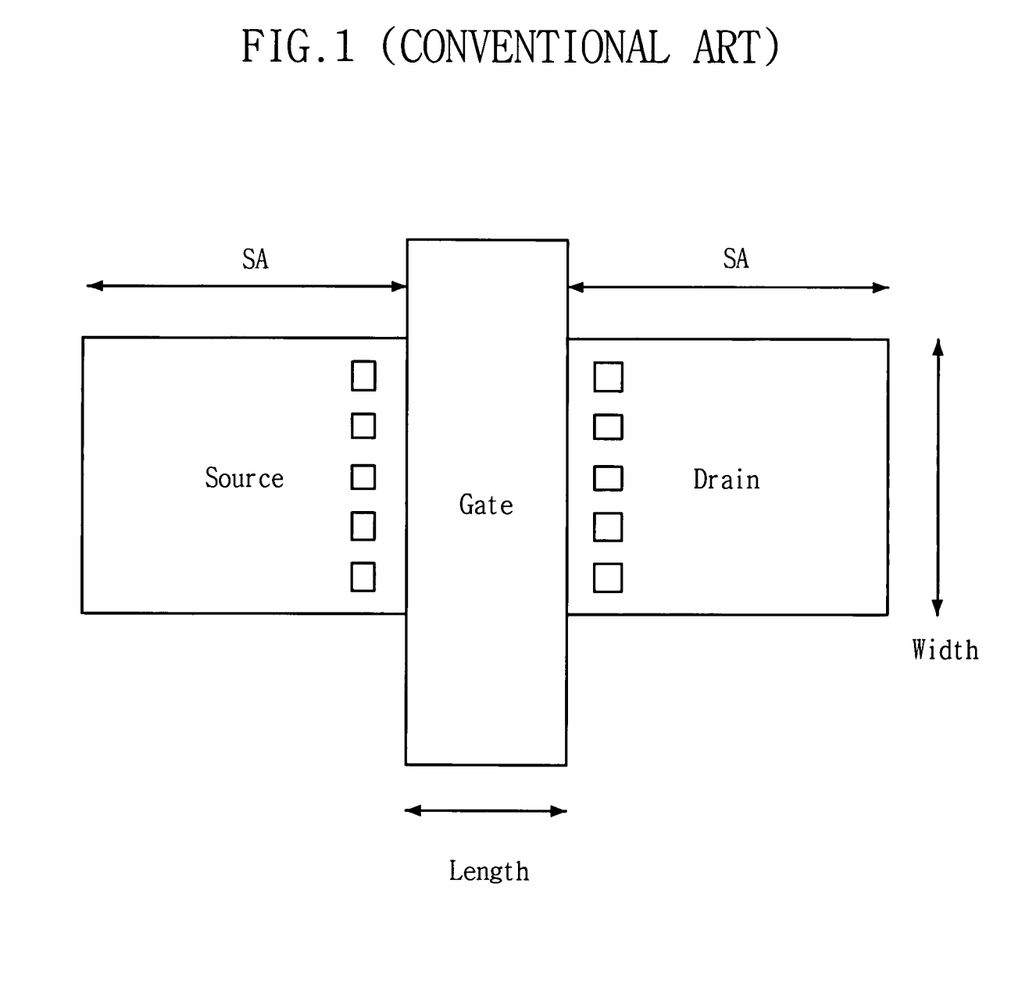
FIG. 1 illustrates a plane structure of conventional MOS transistor.
Figure 2:
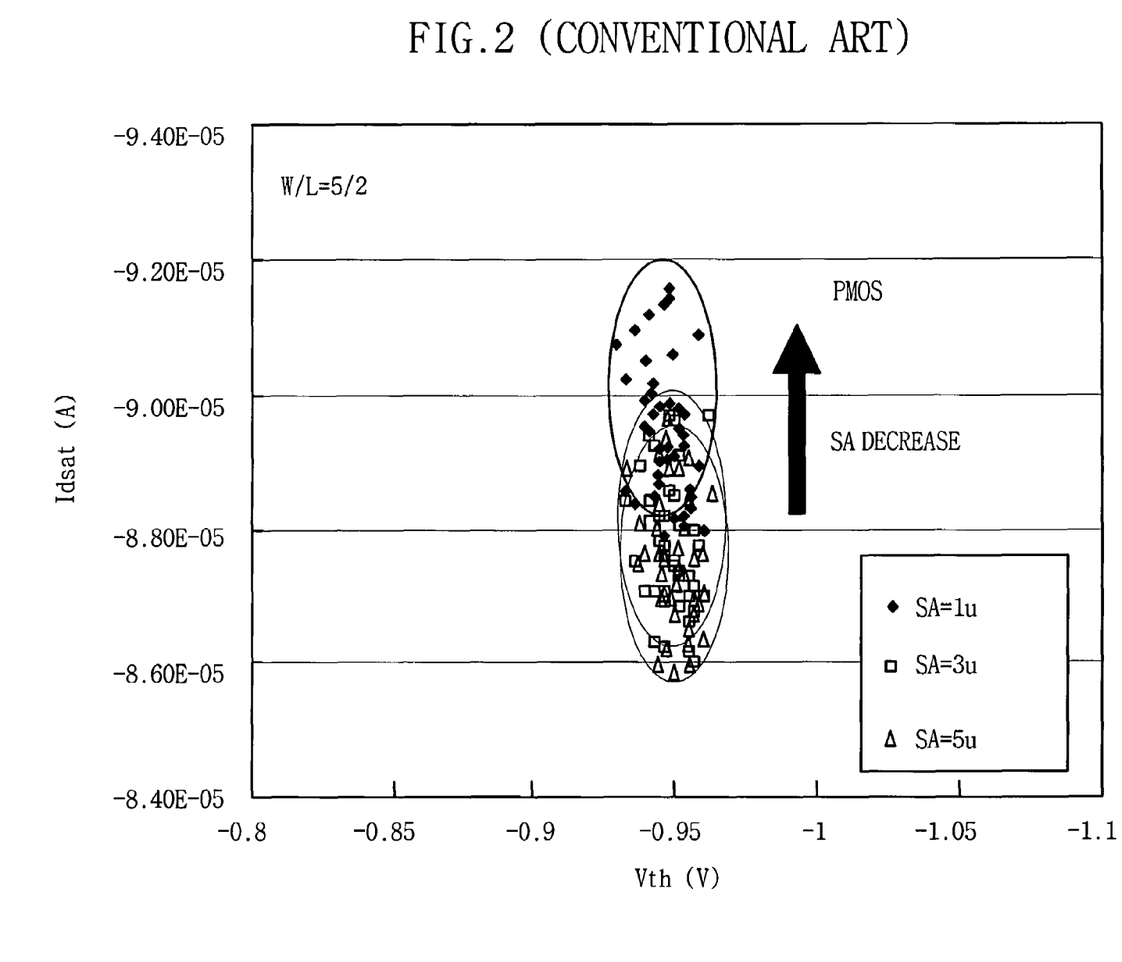
FIG. 2 is a graph illustrating a current characteristic based on a reduced size of active region when a MOS transistor of FIG. 1 is a PMOS transistor.
Figure 3:
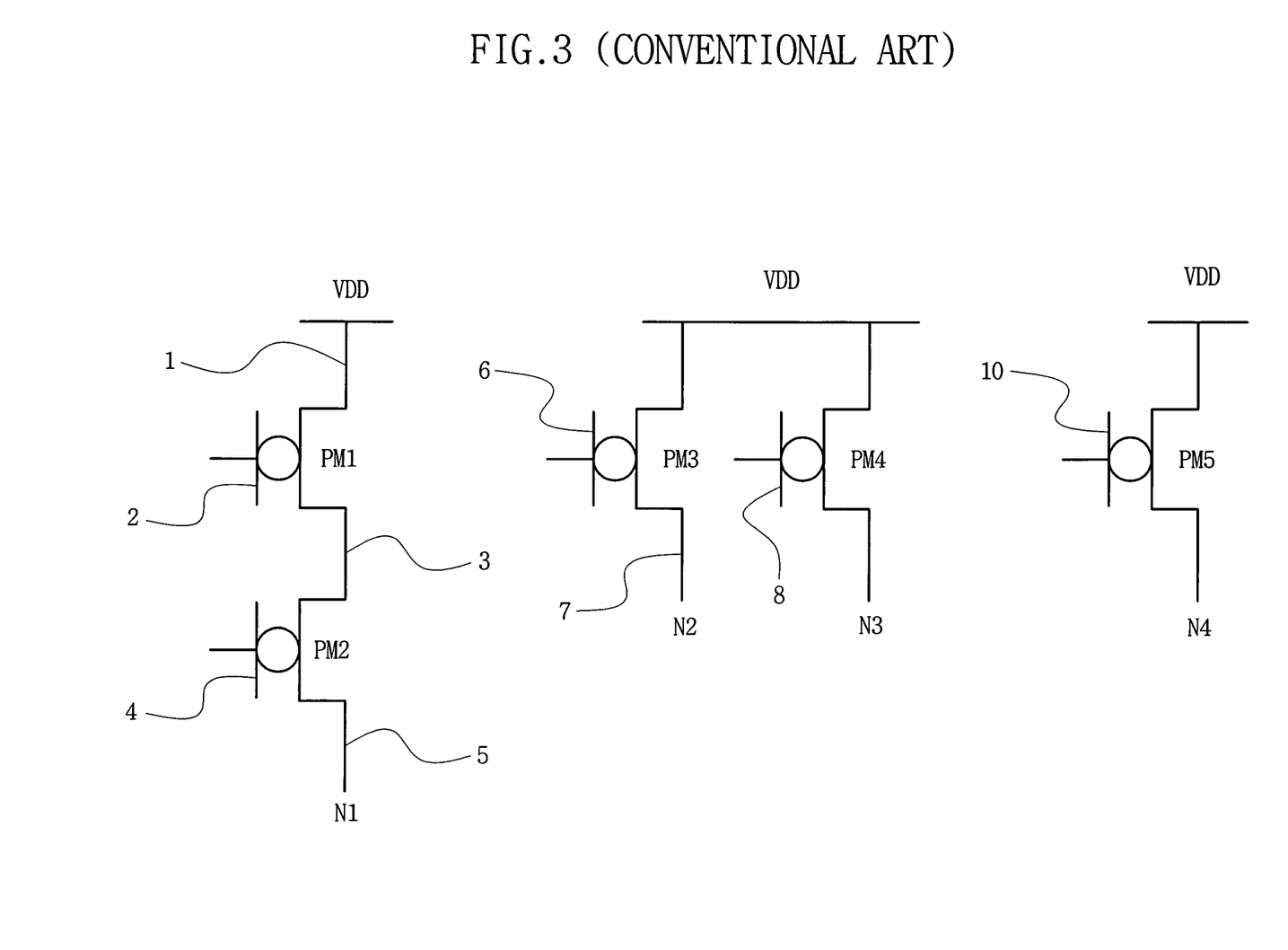
FIG. 3 is an equivalent circuit diagram illustrating a connection of typical MOS transistors.
Figure 4:
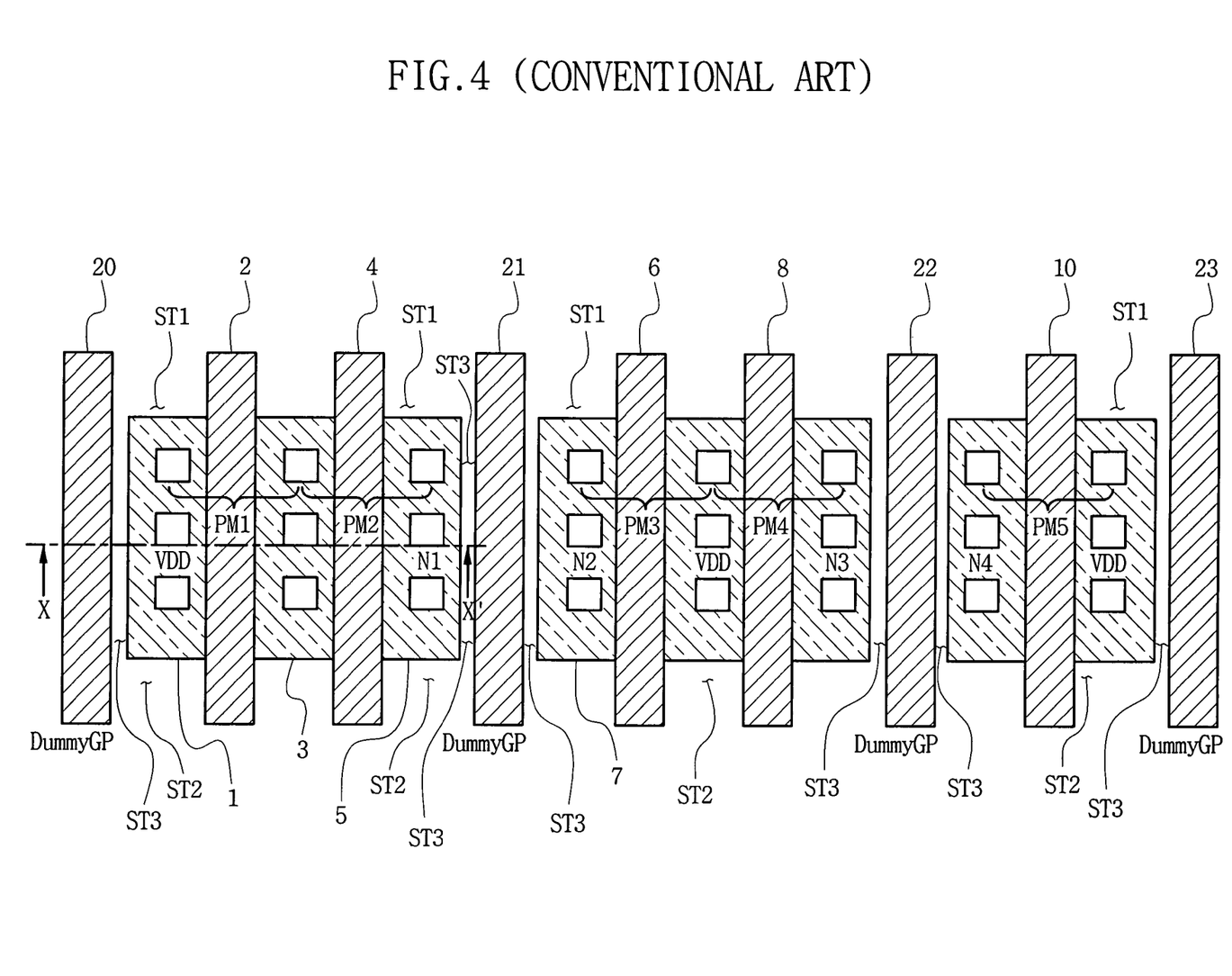
FIG. 4 is a plane layout illustrating an equivalent circuit of FIG. 3 formed on a semiconductor substrate according to a conventional art.
Figure 5:
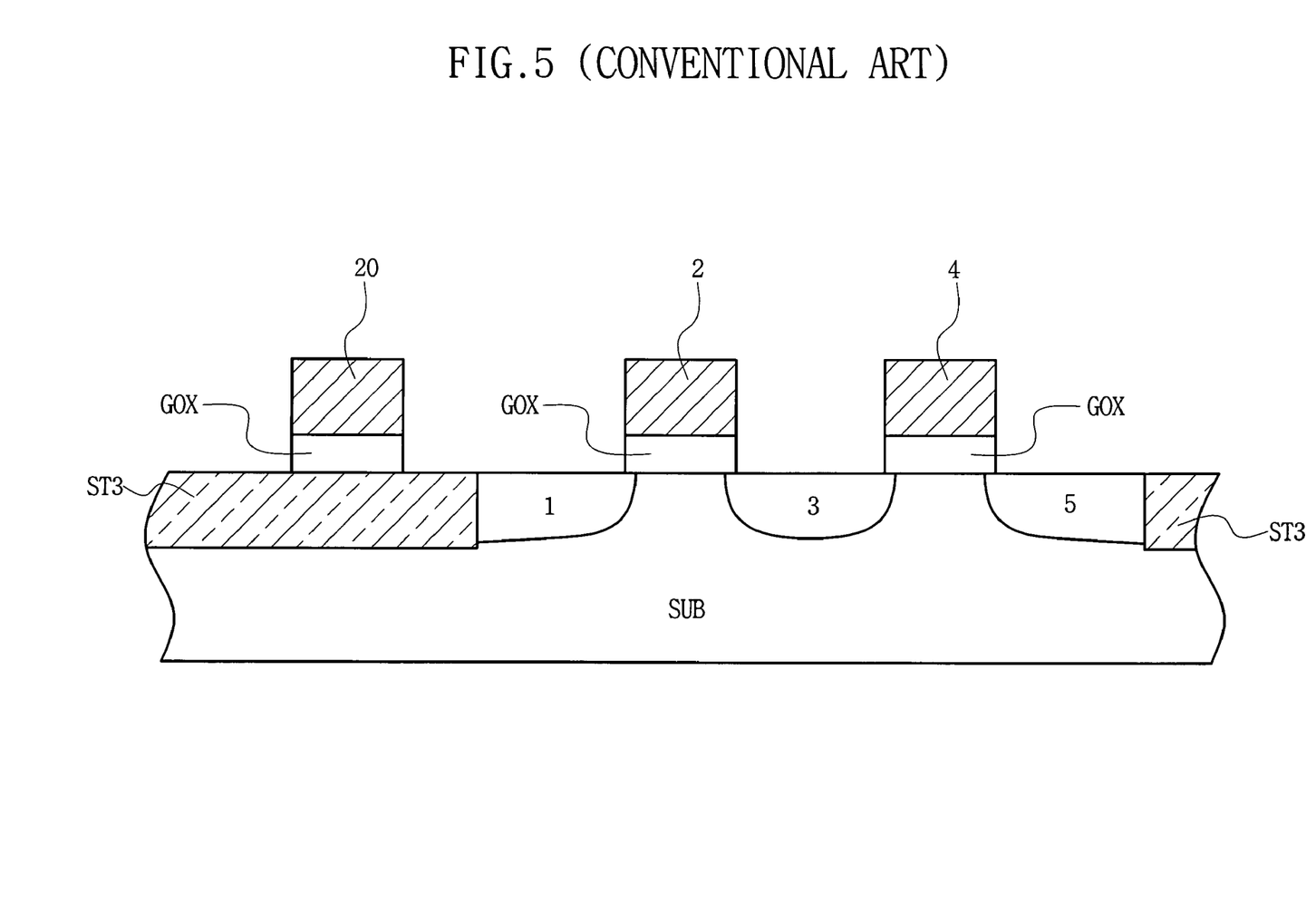
FIG. 5 is a sectional view taken along a line of X-X' in a portion of FIG. 4.

FIG. 1 illustrates a plane structure of a conventional MOS transistor, with the structure that source, gate and drain may be disposed in a gate length direction. FIG. 2 illustrates a current characteristic based on a reduction of active region size SA when the MOS transistor of FIG. 1 is embodied as a PMOS transistor. In FIG. 2, a transverse axis indicates a threshold voltage and a longitudinal axis indicates a drain current. FIG. 3 is an equivalent circuit illustrating various connections of typical P-type MOS transistors, and FIG. 4 illustrates, as an example, a conventional plane layout on a semiconductor substrate. FIG. 5 is a sectional view taken along a line X-X' of FIG. 4.

Referring to FIG. 4, a plurality of dummy gate poly patterns 20, 21, 22 and 23 disposed in parallel in a length direction are formed equally to respective widths and lengths of a plurality of gate poly patterns 2, 4, 6, 8 and 10 of P-type MOS transistors PM1-PM5. These correspond one by one to the transistors PM1-PM5 of FIG. 3, so as to reduce a critical dimension variation in a photolithography process. The dummy gate poly patterns 20, 21, 22 and 23 are not circuits for use in circuit operation, and do not exist on an active region on which source/drain regions 1, 3, 5 and 7 are formed. Rather, the dummy gate poly patterns 20-23 exist on the STI region.

In FIG. 4, the STI region may be divided into first, second and third regions ST1, ST2 and ST3 for convenience of explanation. The first and second regions ST1 and ST2 designate isolation regions, each existing on an upper part and a lower part of the active region of FIG.4. The third region ST3 designates an isolation region existing between the active regions.

With reference to the sectional view of FIG. 5, the dummy gate poly pattern 20 is formed on an upper part of the STI region ST3, such that a gate oxide layer GOX is interposed between the dummy gate poly pattern 20 and the STI region ST3.

In a conventional layout of MOS transistors as shown in FIG. 4, a CD variation of gate poly is reduced in a photolithography process. But, when a scale-down of the device is accelerated, a stress influence of STI increases at an even greater rate. This causes a change in the operating characteristic of the transistor device. In other words, a mechanical influence of STI adversely affects nodes N1 to node N4 in FIG. 3, and also adversely affects a VDD node of a power source voltage. For example, in comparing MOS transistor PM4 with MOS transistor PM5, a source edge part and a drain edge part of the MOS transistor PM5 is entirely in contact with a STI region in a transverse direction as shown, but only a drain edge part of MOS transistor PM4 is in contact with the STI region. Thus, mechanical influences in these two transistors PM4 and PM5 are different from each other.

Referring now to FIG. 2, when the transistor of FIG. 1 is a PMOS transistor, a size SA of the active region representing a length of the drain or source may be reduced. Thus, a current Ids between the drain and source increases as is shown in FIG. 2. On the contrary, in an NMOS transistor, the size SA of the active region is reduced; thus the current Ids between the drain and source is also reduced. Even if a desirable size for the operation of the transistor device can be obtained, the characteristics and operation of the PMOS and NMOS transistors is altered toward another characteristic and/or operation due to the stress of STI, as described above.

Accordingly, a modeling technique of the device should be varied and precise, and a technique to verify and reflect this flexibility and precision may need to be developed. The verification of electrical characteristics of MOS transistors (depending on the given circuit layout) has a limitation as to precision. Thus, a different layout may be required in an effort to substantially reduce mechanical influences caused by the STI process.

Figure 6:
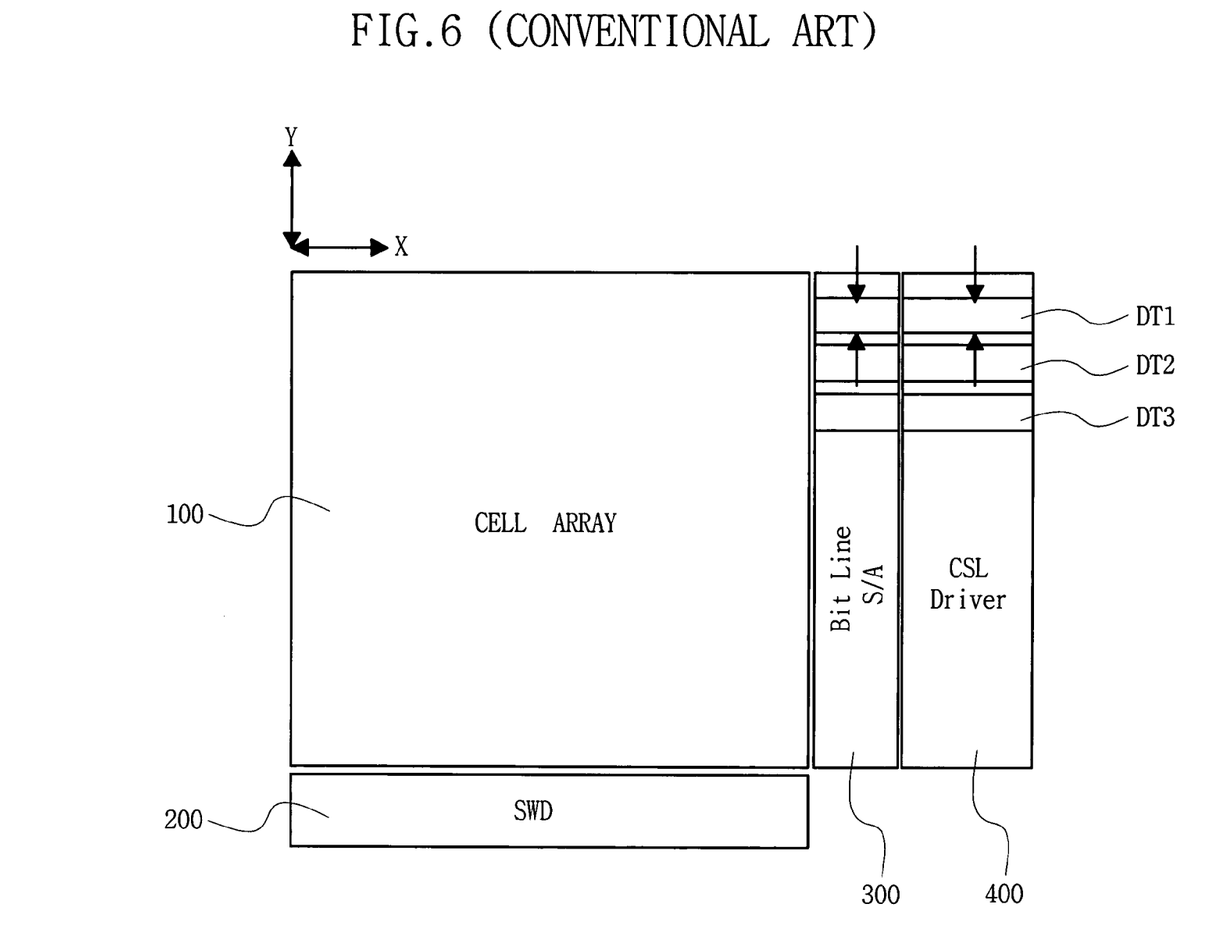
FIG. 6 is a block diagram illustrating a core of a conventional semiconductor memory device.

FIG. 6 is a block diagram illustrating a core of a conventional semiconductor memory device. As shown in FIG. 6, a semiconductor memory device such as DRAM includes a column selection line driver 400 to drive a column selection line CSL which is connected to a memory cell array 100. In the core block of the conventional semiconductor memory device, the Y-directional size of column selection line driver transistors DT1, DR2 and DT3 within the column selection line driver 400 is determined based on a unit pitch of a plurality of bit line sense amplifiers that individually correspond to, and are connected to, bit lines of the memory cell array 100. That is, for the layout of driver transistors in a conventional column decoder, there is a limitation that the transistors are to be installed within a range of a unit pitch of the sense amplifiers in the Y-direction. Thus, the size of the gate poly for the driver transistor is large in the X-direction of FIGS. 7 and 8, in order to obtain the required driving function.

Figure 7:
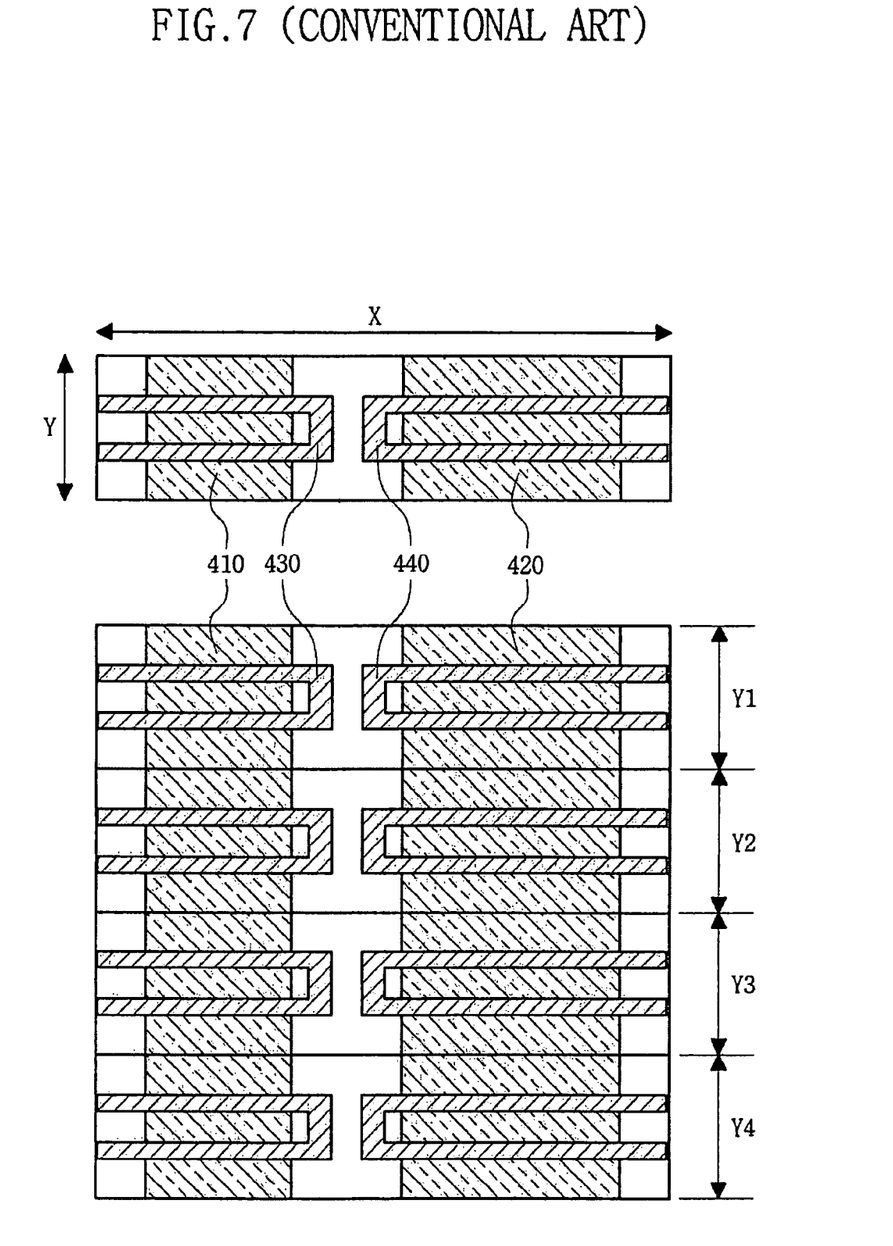
FIG. 7 is a plan view illustrating an example of layout of transistors within a CSL driver of FIG. 6 according to a conventional art.
Figure 8:
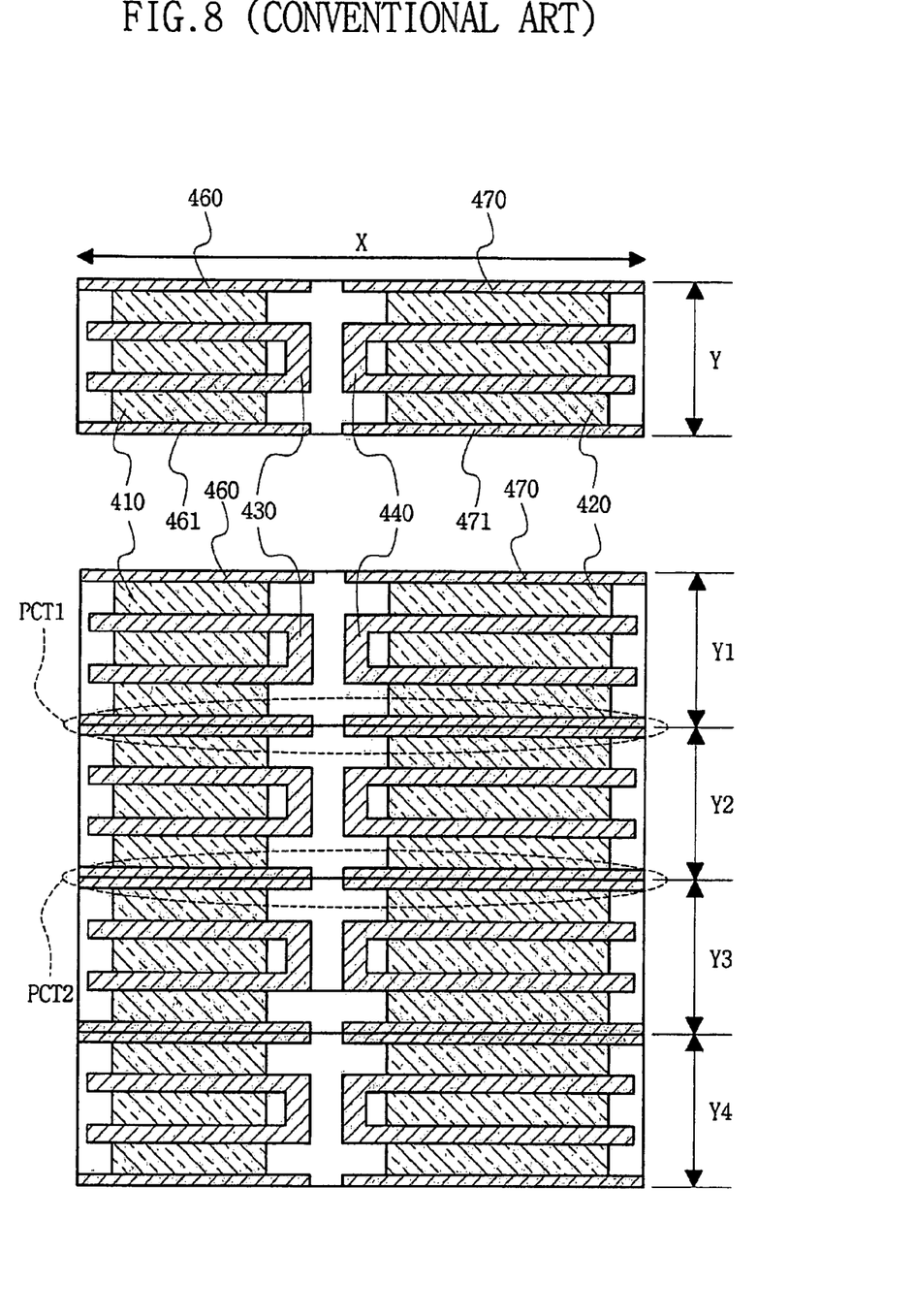
FIG. 8 is a plan view illustrating another example of layout of transistors within a CSL driver of FIG. 6 according to a conventional art.

FIG. 7 is a plane view illustrating one layout example of transistors within a CSL driver of FIG. 6 according to the conventional art, and FIG. 8 is a plane view illustrating another layout example of transistors within the CSL driver of FIG. 6 according to the conventional art.

Referring to FIG. 7, the size of NMOS and PMOS transistors in the Y direction is limited to a unit pitch of a given sense amplifier, and is extended in an X direction. Reference number 410 indicates an active region that is doped with an n-type impurity, and reference number 420 indicates an active region doped with a p-type impurity. A gate oxide layer is formed as an NMOS transistor, and a gate poly 430 formed on the n-type active region 410 is divided and disposed as a finger type of structure.

Also, a gate oxide layer is formed as a PMOS transistor, and the gate poly 440 formed on the p-type active region 420 is divided and disposed as a finger type structure. When the gate poly is formed in the finger type and corresponding fingers function as a gate electrode, transistors corresponding to the number of fingers share an active junction. In other words, a relatively large drive capability can be obtained within a given, determined size.

However, it is difficult to dispose the gate poly in a type of three or more fingers, which is why there is a limitation that the size of transistors be within a range of unit pitch of a bit line sense amplifier in a Y direction. That is, the size of the Y direction is limited, thus the size in the X direction should be extended to increase a drive capability.

Referring now to FIG. 8, gate polys 460 and 470 are shown, for use as power capacitance adjacent to a gate poly of finger type in an X direction. Additionally the gate polys 460, 470 are disposed with a uniform interval, and basically employ the layout of FIG. 7. FIG. 8 illustrates a plane structure which includes gate polys of a finger type in an edge space. The plane structure also includes transistors PCT1 and PCT2 for use as power capacitance, in an edge space as is shown. The size of the X, Y direction in FIG. 8 is equal to the size of X, Y direction of FIG. 7.

As described above with reference to FIGS. 7 and 8, the conventional layout of MOS transistors has a problem in that the size of the transistor increases in one direction. This adversely influences high integration of devices.

SUMMARY OF THE INVENTION

An example embodiment of the present invention is directed to a layout structure of a plurality of metal oxide semiconductor (MOS) transistors. The layout structure includes a first group of MOS transistors having first drain regions and first source regions that are individually allocated to a group active region that is isolated from all sides by a trench isolation, and a second group of MOS transistors having second drain regions and second source regions allocated to the group active region. The second group is disposed between the first group and an edge of the group active region. One or both of the first drain regions and first source regions are not in contact with an edge of the trench isolation in a length direction of a finger-type gate electrode.

Another example embodiment of the present invention is directed to a method of disposing MOS transistors during device fabrication in an active region defined by a device isolation region. In the method, a group active region is formed so that respective ones of a plurality of active regions of the MOS transistors are combined with one another without separation via the device isolation region in a first direction. A plurality of gate polysilicon layers of the MOS transistors are formed, and a plurality of dummy gate polysilicon layers are interposed between the gate polysilicon layers and arranged on an edge thereof on the group active region in a second direction which intersects the first direction and is in parallel with a uniform interval.

Another example embodiment of the present invention is directed to a method of disposing MOS transistors on an active region defined by a device isolation region. In the method, active regions of the MOS transistors are allocated within one group active region that is surrounded by the device isolation region. Dummy gate electrodes are individually formed in parallel with gate electrodes between the gate electrodes of the MOS transistors to obtain electrical insulation between the MOS transistors.

Another example embodiment of the present invention is directed to a method of disposing a dummy gate electrode adjacent to a gate electrode included in each of a plurality of MOS transistors. In the method, the dummy gate electrode is formed in parallel with the gate electrode within a group active region of the MOS transistors. The group active region is surrounded with a shallow trench isolation region so as to provide electrical insulation in a gate length direction between each of the MOS transistors.

Another example embodiment of the present invention is directed to a method of disposing a gate electrode on an active region of a MOS transistor. In the method, a plurality of first gate fingers and second gate fingers are disposed in parallel with each other on a first region of the active region in a first direction, so as to be connected with each other in a second direction that intersects the first direction but is exterior to the first region. A third gate finger is disposed in parallel with the second gate finger on a second region of the active region, to be connected to the second gate finger in the second direction on an exterior of the second region.

Another example embodiment of the present invention is directed to a layout structure of a plurality of MOS transistors. The layout structure includes a first group of MOS transistors, each having a corresponding first drain region and a first source region in parallel. The first source and drain regions are individually allocated to a group active region that is isolated from all sides thereof by a shallow trench isolation.

The layout structure includes a second group of MOS transistors, each having a corresponding second drain region and a second source region, with the second source and drain regions allocated to the group active region. The second group is disposed between the first group and an edge of the group active region.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of example embodiments therein.

DETAILED DESCRIPTION OF THE EXAMPLE EMBODIMENTS

The example embodiments are more fully described below with reference to FIGS. 9 to 12, in which like components having like functions include like reference symbols and numerals. The present invention may however be embodied in many different forms and should not be construed as being limited to the example embodiments set forth herein. Rather, these example embodiments are provided so that this disclosure is thorough and complete, and conveys the concept of the invention to those skilled in the art.

Figure 9:
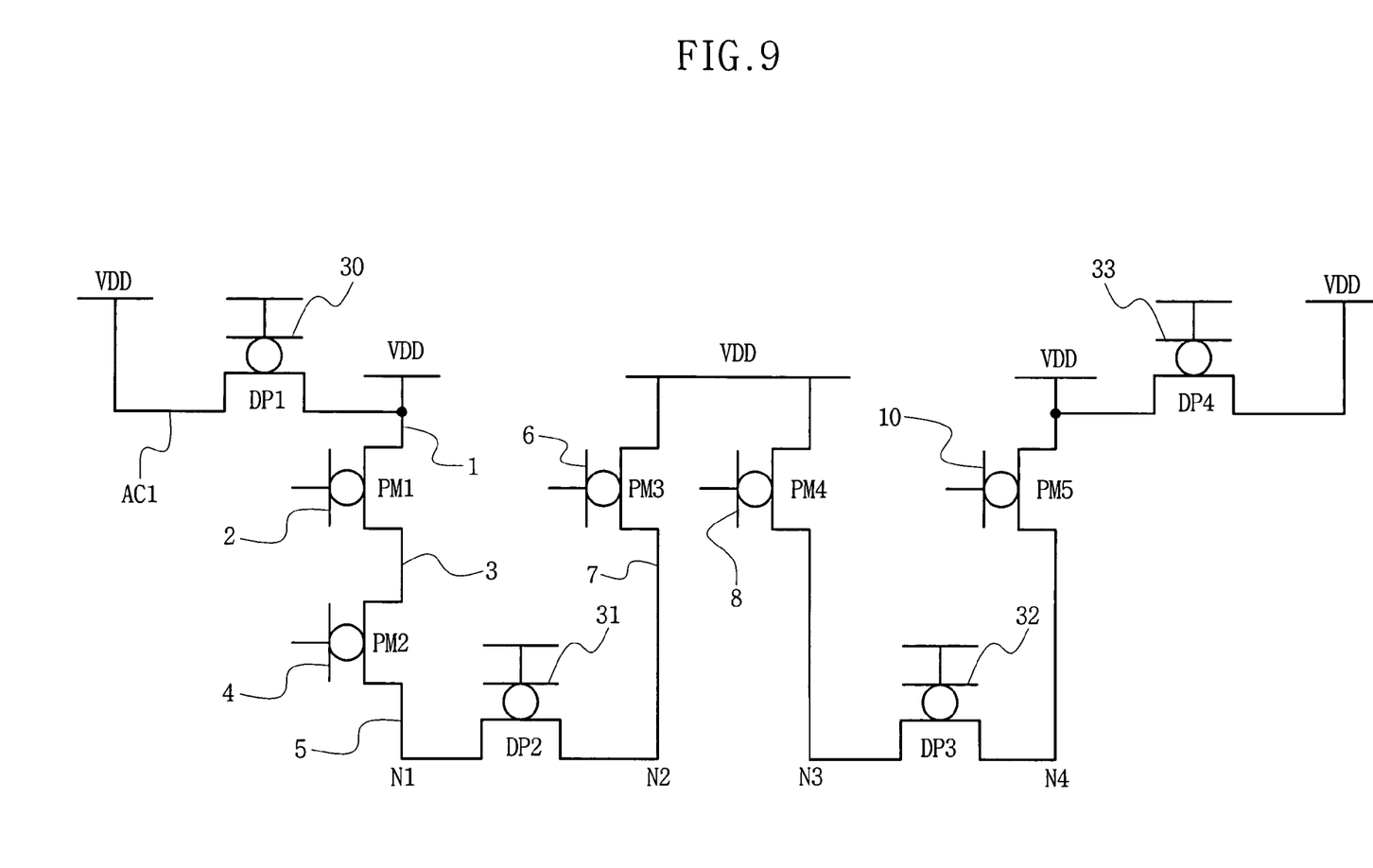
FIG. 9 illustrates an equivalent circuit of MOS transistors connected according to an example embodiment of the present invention.
Figure 10:
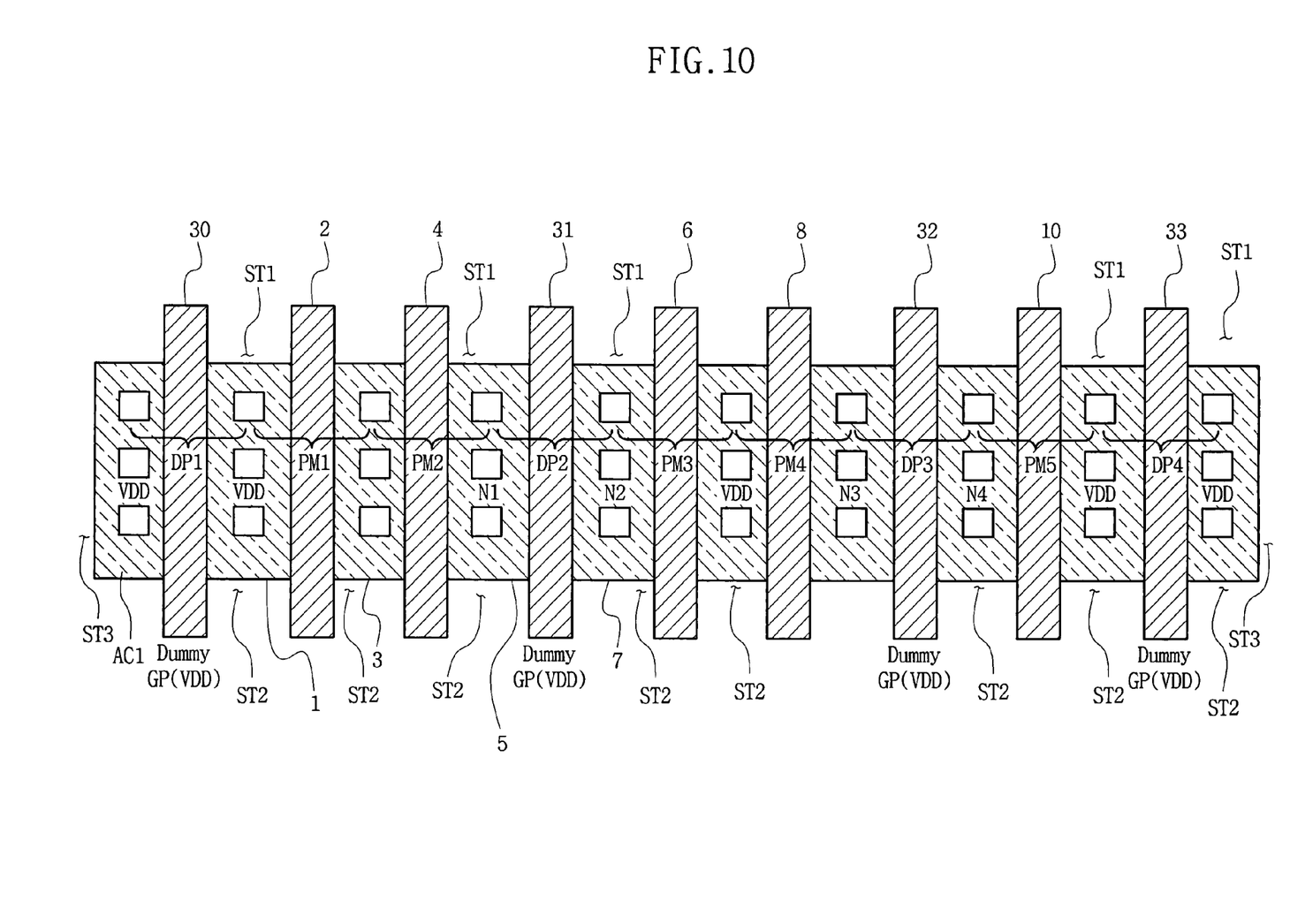
FIG. 10 is a plan view illustrating a layout of an equivalent circuit of FIG. 9 formed on a semiconductor substrate, according to an example embodiment of the present invention.
Figure 11:
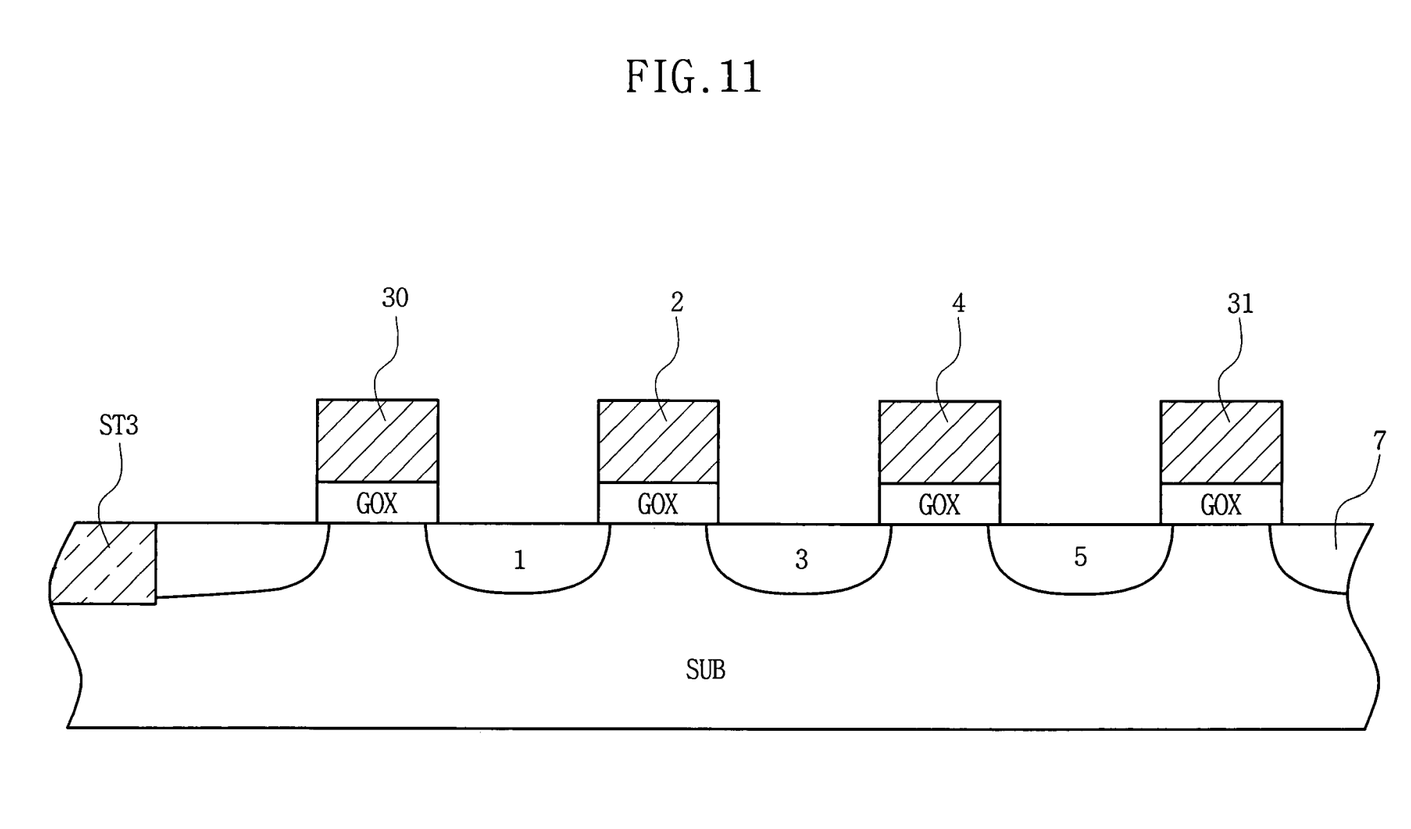
FIG. 11 is a sectional view taken along a line in a portion of FIG. 10.

FIG. 9 is an equivalent circuit diagram of MOS transistors connected according to an example embodiment of the present invention. FIG. 10 is a plan view illustrating a layout of equivalent circuit of FIG. 9 formed on a semiconductor substrate according to an example embodiment of the present invention; and FIG. 11 is a sectional view taken along a line in a portion of FIG. 10.

FIG. 9, referring to an equivalent circuit structure includes first to fifth P-type MOS transistors PM1-PM5 and first to fourth dummy P-type MOS transistors DP1-DP4 which are connected with one another. The first to fifth P-type MOS transistors PM1-PM5 perform a circuit operation, and the first to fourth dummy P-type MOS transistors DP1-DP4 may be transistors used in forming a dummy gate pattern to reduce a critical dimension variation, or used in performing an insulation function or power capacitance function. Transistors DP1-DP4 do not contribute to operation of the circuit.

Referring to FIG. 10, the circuit includes a first group of MOS transistors PM1-PM5 having first drain regions and first source regions in parallel. The first group of MOS transistors PM1-PM5 are allocated to a group active region AC1 that is isolated from all sides by a shallow trench isolation STI. The second group of MOS transistors DP1-DP4 include second drain regions and second source regions respectively allocated to the group active region AC1, and are arranged between the first group of MOS transistors PM1-PM5 and an edge of the region AC. The first drain regions and/or first source regions of the first group of MOS transistors PM1-PM5 are not in contact with the shallow trench isolation edge in a gate length direction, and are electrically isolated by gates of the second group of MOS transistors DP1-DP4.

That is, in the layout of transistors in FIG. 10, dummy gate poly patterns 30, 31, 32 and 33 of the second group of MOS transistors DP1-DP4 are formed as patterns which equal the patterns of the gate poly patterns 2, 4, 6, 8 and 10 of transistors used in actual operations, in parallel on one common active region AC1. Thus, in the gate poly patterns 2, 4, 6, 8 and 10 of the P-type MOS transistors PM1-PM5 corresponding to FIG. 9, a CD variation may be reduced in a photolithography process, so that a shallow trench isolation stress influence may be reduced.

The dummy gate poly patterns 30, 31, 32 and 33 are also formed in an upper part of the active region AC1 on which source/drain regions 1, 3, 5 and 7 are formed. Thus, the source/drain regions of the first group of MOS transistors PM1-PM5 used for actual device operation are in contact with the shallow trench isolation region, but are only in contact with two faces of regions ST1 and ST2. The source/drain regions of the first group of MOS transistors PM1-PM5 are not in contact with these two faces in a gate length direction.

With reference to FIG. 11, the dummy gate poly patterns 30 and 31 may be formed on the active region, but not on the shallow trench isolation region ST3. The formation of dummy gate poly patterns 30 and 31 in FIG. 11 is thus discriminated from that of conventional art FIG. 5.

Referring to FIG. 10, when dummy gate poly patterns 30 and 33 are positioned on the right and left edges of the active region, and dummy gate poly patterns 31 and 32 formed as insulation between transistors, are biased to power source voltage VDD, the second group of MOS transistors DP1-DP4 perform an isolation function. Then, a second P-type MOS transistor PM2 may be electrically isolated from a third P-type MOS transistor PM3, and a fourth P-type MOS transistor PM4 may be electrically isolated from a fifth P-type MOS transistor PM5. All active region sizes SA of the first group MOS transistors PM1-PM5 have the same structure, thus a mechanical influence from the STI may be removed. Further, a specific area increase may be insignificant, and a critical dimension variation of gate poly can be relatively reduced.

In FIG. 10, the first group of MOS transistors PM1-PM5 are P-type MOS transistors, thus as described above a power source voltage may be applied to gate poly thereof. If the first group are N-type MOS transistors, a ground voltage may be applied to gate poly thereof. On the other hand, the dummy gate poly patterns 30 and 33 positioned on the right and left edges of active region can be used as a power capacitance.

Nodes N1-N4 shown in FIGS. 9 and 10 are electrically isolated from each other by the second group of MOS transistors DP1-DP4 having the dummy gate poly patterns 30, 31, 32 and 33 as a gate electrode. In other words, a source or drain region of the first group of MOS transistors PM1-PM5 is not in contact with the shallow trench isolation region ST3 in a gate length direction. Meanwhile, three patterns of a generally square shape shown between each gate poly pattern within the active region of FIG. 10 indicate contact, such as a tungsten contact.

Figure 12:
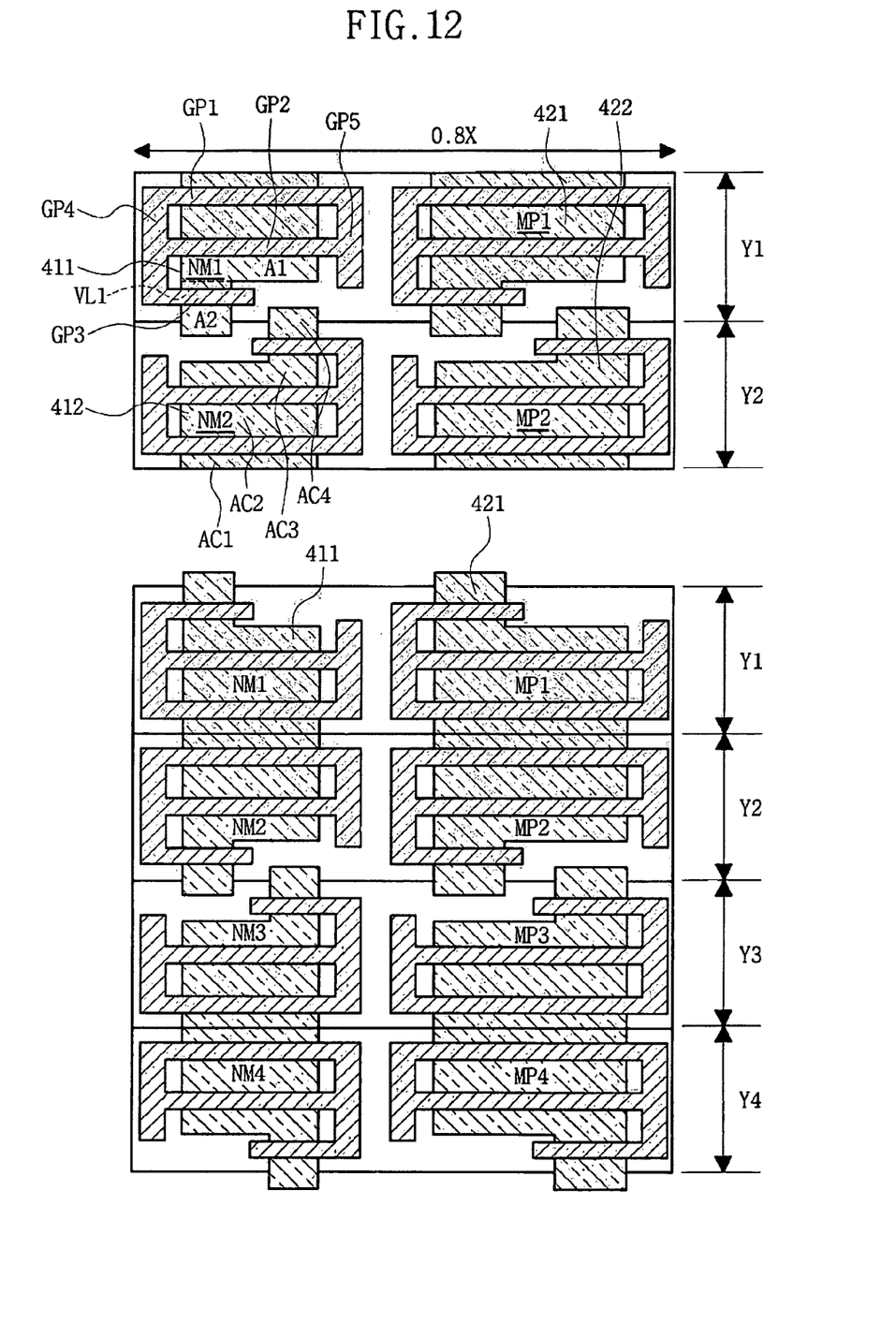
FIG. 12 is a plan view illustrating a layout example of transistors in a CSL driver according to another example embodiment of the present invention.

FIG. 12 is a plan view illustrating a layout example of transistors formed in a CSL driver according to another example embodiment of the invention. Referring to FIG. 12, the gate electrode layout of MOS transistors has a size similar to that described in FIGS. 7 and 8 in a Y direction, but has a size that is reduced by about 20% from the X direction size in FIGS. 7 and 8.

In the gate electrode layout of transistor NM1, an active region may be constructed of a first region A1 having a given first size and a second region A2 having a second size smaller than the first size. The active region may be a combination of two regions A1 and A2 provided from the boundary of a virtual separation line VL1. Three fingers may be disposed on the formed active region of FIG. 12 in an X direction, thus forming a gate electrode of the N-type MOS transistor NM1.

First and second gate fingers GP1 and GP2 may be disposed in parallel with each other on the first region A1 in a first direction of the active region ({i.e.} X direction). First and second gate fingers GP1 and GP2 may be connected to each other through connection fingers GP4 and GP5 in a second direction which vertically intersects the first direction of the active region, exterior to the first region A1.

A third gate finger GP3 may be disposed in parallel with the second gate finger GP2 on the second region A2, and exterior from the second region A2 may be connected with the second gate finger GP2 through a connection finger GP4 in the second direction ({i.e.} Y direction). The size of the third gate finger GP3 in the X direction may be substantially smaller than an X directional size of the first or second gate finger GP1, GP2. That is, about 2.5 gate fingers may be disposed in the active region.

Thus, the first and second gate fingers may be disposed mutually in parallel, with a mutually equal first given length. The third gate finger may have a length less than about half of the first given length, and may be disposed in parallel with the second gate finger.

In FIG. 12, the N-type MOS transistor NM2 is disposed in a lower part of the N-type MOS transistor NM1, and includes an active region that may be the same as an active region of the N-type MOS transistor NM1. But, in a layout direction the second regions A2 face each other. Then, the third gate fingers (belonging to mutually adjacent MOS transistors) may be disposed in face to face relation in a gate length direction.

Meanwhile, in a P-type MOS transistor MP1 disposed on the right side of the N-type MOS transistor NM1, the layout arrangement may be the same as the above description. That is, active regions 421 and 422 of P-type MOS transistors MP1 and MP2 may be disposed to face each other, and the third gate fingers may be disposed to face each other in the Y direction. In FIG. 12, the layout shown in an upper side of the drawing illustrates a layout relation of a total four N-type and P-type MOS transistors. The layout shown in a lower side illustrates a layout relation extended for eight MOS transistors. In any case, the size in the Y direction is limited to a unit pitch of a sense amplifier. The layout may be reduced by about 20% as compared with a conventional case in the X direction.

As described above, in forming column selection line driver transistors, a gate poly finger is designed to be disposed facing a gate poly finger of an adjacent transistor, as shown in FIG. 12. Thus, the length of the column selection line driver transistor may be maintained, and chip size may be effectively reduced in the X direction.

In applying the technical arrangement of FIG. 12 to FIG. 10, gates of the first and second group of MOS transistors shown in FIG. 10 may be formed individually with three fingers (about 2.5 fingers) as shown in FIG. 12. At this time, the active region may be formed as one common active region.

According to the example embodiments of the present invention, a variation of a critical dimension of gate poly may be small by performing a gate patterning, possibly performing a photolithography process under 80 nanometers (nm). The layout structure according to the example embodiments of the present invention may thus be applied to a high performance, small area and may provide a litho-friendly layout.

As described above, in a layout structure of transistors according to the example embodiments of the present invention, previous problems caused by a high integration (such as an influence of shallow trench isolation stress, etc.) may be substantially reduced. Transistors constituting a circuit may thus be disposed more effectively within a given limited size.

It will be apparent to those skilled in the art that modifications and variations can be made to the example embodiments of the present invention without deviating therefrom. For example, layout positions of p-type and n-type MOS transistors may be altered or modified. A shape of the gate pattern of a column selection line driver transistor in a column decoder may be also altered or modified. Accordingly, these and other changes and modifications may be understood as being within the example embodiments of the present invention as defined by the appended claims.

What is claimed is:

1. A layout structure of a plurality of metal oxide semiconductor (MOS) transistors, comprising:
a first group of MOS transistors having first drain regions and first source regions that are individually allocated to one of a plurality of active regions that is isolated from all sides by a trench isolation,
a second group of MOS transistors having second drain regions and second source regions allocated to a second active region of the plurality of active regions, each of the second group of MOS transistors being dummy transistors configured to provide electrical isolation, and the second group disposed between the first group and an edge of the active regions, wherein one or both of the first drain regions and first source regions are not in contact with an edge of the trench isolation in a length direction of a finger-type gate electrode, and
a gate of the first group and second group of MOS transistors formed of three fingers, the gate including,
a first and a second gate finger with a same first given length disposed in parallel and connected to each other at both ends, and
a third gate finger having a length less than half of the first given length disposed in parallel with the second gate finger, the third gate fingers belonging to mutually adjacent MOS transistors disposed facing each other in a gate length direction.

2. A layout structure of a plurality of MOS transistors, comprising:
a first group of MOS transistors, each having a corresponding first drain region and a first source region in parallel, the first source arid drain regions individually allocated to one of a plurality of active regions that is isolated from all sides thereof by a shallow trench isolation, a second group of MOS transistors, each having a corresponding second drain region and a second source region, each of the second group of MOS transistors being dummy transistors configured to provide electrical isolation, the second source and drain regions allocated to a second active region of the plurality of active regions, the second group disposed between the first group and an edge of the active regions, and a gate of the first and second group of MOS transistors is formed of three fingers, the gate including, a first and a second gate finger with a same first given length disposed in parallel and connected to each other at both ends, and a third gate finger having a given length less than half of the first length and disposed in parallel with the second gate finger, the third gate fingers belonging to mutually adjacent MOS transistors disposed facing each other in a gate length direction.

3. The layout structure of claim 2, wherein one of the first source and first drain regions are not in contact with an edge of the shallow trench isolation in a gate length direction, and are electrically isolated by a gate of one of the second group of MOS transistors.

4. The layout structure of claim 3, wherein the first group of MOS transistors is for device operation and the second group of MOS transistors provides an isolation function.

* * * * *